(12) United States Patent
Zhang et al.

(10) Patent No.: US 11,927,841 B2
(45) Date of Patent: Mar. 12, 2024

(54) DISPLAY PANEL AND DISPLAY APPARATUS

(71) Applicant: BOE TECHNOLOGY GROUP CO., LTD., Beijing (CN)

(72) Inventors: Yafei Zhang, Beijing (CN); Hai Yu, Beijing (CN); Yanzhao Li, Beijing (CN); Feng Qu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 59 days.

(21) Appl. No.: 17/771,951

(22) PCT Filed: Jun. 10, 2021

(86) PCT No.: PCT/CN2021/099277
§ 371 (c)(1),
(2) Date: Apr. 26, 2022

(87) PCT Pub. No.: WO2022/022094
PCT Pub. Date: Feb. 3, 2022

(65) Prior Publication Data
US 2022/0373837 A1 Nov. 24, 2022

(30) Foreign Application Priority Data
Jul. 28, 2020 (CN) .......................... 202010738849.4

(51) Int. Cl.
*G02F 1/1333* (2006.01)
*G02F 1/1335* (2006.01)
(Continued)

(52) U.S. Cl.
CPC .. *G02F 1/133314* (2021.01); *G02F 1/133553* (2013.01); *G02F 1/13439* (2013.01);
(Continued)

(58) Field of Classification Search
CPC ..................................................... G02F 1/1333
See application file for complete search history.

(56) References Cited

U.S. PATENT DOCUMENTS

2003/0038751 A1* 2/2003 Iwai ....................... H01Q 1/243
343/702
2011/0210903 A1 9/2011 Sarabandi et al.
(Continued)

FOREIGN PATENT DOCUMENTS

| CN | 1407653 A | 4/2003 |
| CN | 201044264 Y | 4/2008 |

(Continued)

OTHER PUBLICATIONS

China Patent Office, CN202010738849.4 First Office Action dated Jun. 6, 2022.

*Primary Examiner* — Sang V Nguyen
(74) *Attorney, Agent, or Firm* — HOUTTEMAN LAW LLC

(57) ABSTRACT

The disclosure provides a display panel and a display apparatus, and belongs to the field of display technology. The display panel includes a display backplane and an antenna structure; the display panel further includes a frequency selective surface on a side of the antenna structure close to a light exit surface of the display panel; the frequency selective surface is configured to transmit an electromagnetic wave with a specific frequency, so as to enhance a radiation gain of the antenna structure.

18 Claims, 3 Drawing Sheets

(51) Int. Cl.
    *G02F 1/1343*   (2006.01)
    *H01P 3/08*     (2006.01)
    *H01Q 13/20*    (2006.01)
    *H01Q 15/00*    (2006.01)
    *H10K 59/00*    (2023.01)
(52) U.S. Cl.
    CPC ........... *H01P 3/081* (2013.01); *H01Q 13/206* (2013.01); *H01Q 15/0013* (2013.01); *H10K 59/00* (2023.02)

(56)  References Cited

U.S. PATENT DOCUMENTS

| | | | |
|---|---|---|---|
| 2013/0088408 A1 | 4/2013 | Sim | |
| 2018/0062233 A1* | 3/2018 | Lindsey | H01P 1/2005 |
| 2018/0203309 A1* | 7/2018 | Cowell, III | G02F 1/133528 |
| 2019/0115646 A1 | 4/2019 | Chiu et al. | |
| 2020/0185836 A1* | 6/2020 | Wang | H01Q 1/364 |

FOREIGN PATENT DOCUMENTS

| | | | | |
|---|---|---|---|---|
| CN | 2012253588 A | 12/2012 | | |
| CN | 102904065 A | 1/2013 | | |
| CN | 105742797 A | 7/2016 | | |
| CN | 106887692 A | 6/2017 | | |
| CN | 107302138 A | 10/2017 | | |
| CN | 20792640 | * 9/2018 | ............. | G06F 1/041 |
| CN | 207924640 U | 9/2018 | | |
| CN | 109119752 A | 1/2019 | | |
| CN | 109742550 A | 5/2019 | | |
| CN | 110416739 A | 11/2019 | | |
| CN | 110650603 A | 1/2020 | | |
| CN | 110679038 A | 1/2020 | | |
| CN | 110708406 A | 1/2020 | | |
| IN | 104396358 A | 3/2015 | | |

* cited by examiner

DISPLAY PANEL AND DISPLAY APPARATUS

TECHNICAL FIELD

The present disclosure belongs to the field of display technology, and in particular relates to a display panel and a display apparatus.

BACKGROUND

As a component for transmitting or receiving a radio wave, an antenna is an indispensable part in a wireless communication system. With a rapid development of wireless communication, requirements on the antenna are higher and higher. With a use of a full-screen display, a clearance area reserved for the antenna in a display panel such as a mobile phone, a tablet computer or a television is smaller and smaller, and due to large space transmission loss of a millimeter wave, a coverage area of the millimeter wave is seriously influenced by a metal frame and a metal rear cover.

SUMMARY

The present disclosure is directed to at least one of the technical problems of the prior art, and provides a display panel and a display apparatus.

In a first aspect, an embodiment of the present disclosure provide a display panel, including a display backplane and an antenna structure; wherein the display panel further includes a frequency selective surface on a side of the antenna structure close to a light exit surface of the display panel; and the frequency selective surface is configured to transmit an electromagnetic wave with a specific frequency, so as to enhance a radiation gain of the antenna structure.

The display panel has a display area and a peripheral area surrounding the display area; the antenna structure is on a side of the display backplane close to the light exit surface, and at least a part of the antenna structure is in the display area.

The display panel includes a dielectric layer between the frequency selective surface and the antenna structure.

the dielectric layer has a thickness greater than 100 μm.

The dielectric layer includes a first transparent optical adhesive layer, a transparent display substrate layer and a second transparent optical adhesive layer which are stacked together.

The display panel has a display area and a peripheral area surrounding the display area; the antenna structure includes a microstrip line and a reference electrode in a same layer as the microstrip line; the microstrip line is in the display area; and the reference electrode is at least partially in the peripheral area.

The display panel further includes a reflective electrode on a side of the display backplane away from the light exit surface of the display panel; and the reference electrode is connected to the reflective electrode.

The microstrip line includes a mesh structure.

The frequency selective surface includes a transparent planar structure or a mesh structure.

The display backplane includes any one of a liquid crystal display backplane, an organic light-emitting diode display backplane, a quantum dot light-emitting diode display backplane or a quantum dot backlight source display backplane.

In a second aspect, an embodiment of the present disclosure provides a display apparatus, which includes the display panel described above.

Reference numbers are as follows: 1. a display backplane; 2. an antenna structure; 3. a frequency selective surface; 4. a reflective electrode; 5. a dielectric layer; 10. a base substrate; 11. a pixel driving circuit; 12. an organic light-emitting diode; 13. an encapsulation layer; 14. a polarization layer; 15. a touch layer; 16. a lower polarizer; 17. an upper polarizer; 20. an array substrate; 30. a color filter substrate; 40. a liquid crystal layer; 50. a base plate; 60. a back plate; Q1. a display area; Q2. a peripheral area.

DETAIL DESCRIPTION OF EMBODIMENTS

In order to enable one of ordinary skill in the art to better understand the technical solution of the present disclosure, the present disclosure will be further described in detail with reference to the accompanying drawings and the detailed description below.

Unless otherwise defined, a technical or scientific term used herein shall have the ordinary meaning as understood by one of ordinary skill in the art to which the present disclosure belongs. The terms "first", "second", and the like, as used in the present disclosure, do not denote any order, quantity, or importance, but rather are used to distinguish one element from another. Similarly, the term "a", "an", or "the" and the like does not denote a limitation of quantity, but rather denotes the presence of at least one. The term "comprising" or "comprises", and the like, means that the element or item appearing in front of the word "comprising" or "comprises" includes the element or item listed after the word "comprising" or "comprises" and its equivalents, and does not exclude other elements or items. The term "connected" or "coupled" and the like is not restricted to a physical or mechanical connection, but may include an electrical connection, whether direct or indirect. The terms "upper", "lower", "left", "right", and the like are used merely to indicate relative positional relationships, which may also change accordingly when the absolute position of the object being described changes.

It should be noted that, the embodiments of the present disclosure are mainly directed to integrating a millimeter wave antenna in a display panel, and how to ensure that a performance of the antenna is not reduced while a performance of the display panel is not significantly affected. It should be understood that the antenna structure referred to in the embodiments of the present disclosure is not limited to the millimeter wave antenna, and the specific antenna structure may be specifically set according to a communication network to which the display panel is applied.

In addition, in the embodiments of the present disclosure, the display surface of the display panel refers to a side of the display panel on which a picture is displayed when a user views the display panel.

Figure 1:
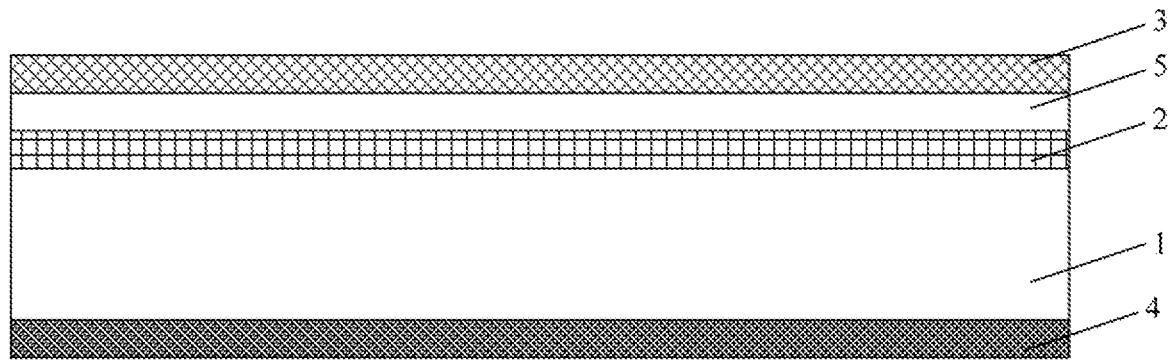
FIG. 1 is a schematic diagram of a structure of a display panel according to an embodiment of the present disclosure.

FIG. 1 is a schematic diagram of a structure of a display panel according to an embodiment of the present disclosure. In a first aspect, as shown in FIG. 1, the present disclosure provides a display panel, which includes a display backplane 1, an antenna structure 2, and a frequency selective surface 3. The frequency selective surface 3 is located on a side of the antenna structure 2 close to the display surface, and is used for transmitting an electromagnetic wave with a specific frequency to enhance a radiation gain of the antenna structure 2.

In an embodiment of the present disclosure, the frequency selective surface 3 is added in the display panel to select a frequency band of the electromagnetic waves received and transmitted by the antenna structure 2, allow the transmission of the electromagnetic waves in a specific frequency band, reflect the electromagnetic waves in other frequency bands, and avoid an interference of electromagnetic wave signals in other frequency bands, thereby increasing the radiation gain of the antenna structure 2, and simultaneously, a bandwidth can be extended to achieve a broadband effect. Particularly, the frequency selective surface 3 added in the embodiment of the present disclosure has a good band-pass function in a 5G (5th generation mobile networks) millimeter wave frequency band. Through verification of simulation experiments, an operating bandwidth of the simulated reflection and transmission performance of the port can simultaneously cover n257 and n258 frequency bands, that is, the frequency selective surface 3 significantly enhances a radiation capability of the millimeter wave antenna.

In some embodiments, the display panel has a display area Q1 and a peripheral area Q2 surrounding the display area Q1, and at least a part of the antenna structure 2 in the embodiment of the present disclosure is located in the display area Q1. It should be understood that the part of the antenna structure 2 located in the display area Q1 should be ensured not to affect a normal display of the display panel, that is, the part of the antenna structure 2 located in the display area Q1 is of a light-transmitting structure.

In some embodiments, the antenna structure 2 includes, but is not limited to, a CPW (coplanar waveguide) antenna, that is, the antenna structure 2 includes a microstrip line 21 and a reference electrode disposed in a same layer. The reference electrode includes, but is not limited to, the ground electrode 22, as long as a current loop can be formed between the microstrip line 21 and the reference electrode. In an embodiment of the present disclosure, the antenna structure 2 is a CPW antenna, and the reference electrode is the ground electrode 22 as an example, which is not intended to limit the scope of the embodiment of the present disclosure.

Figure 2:
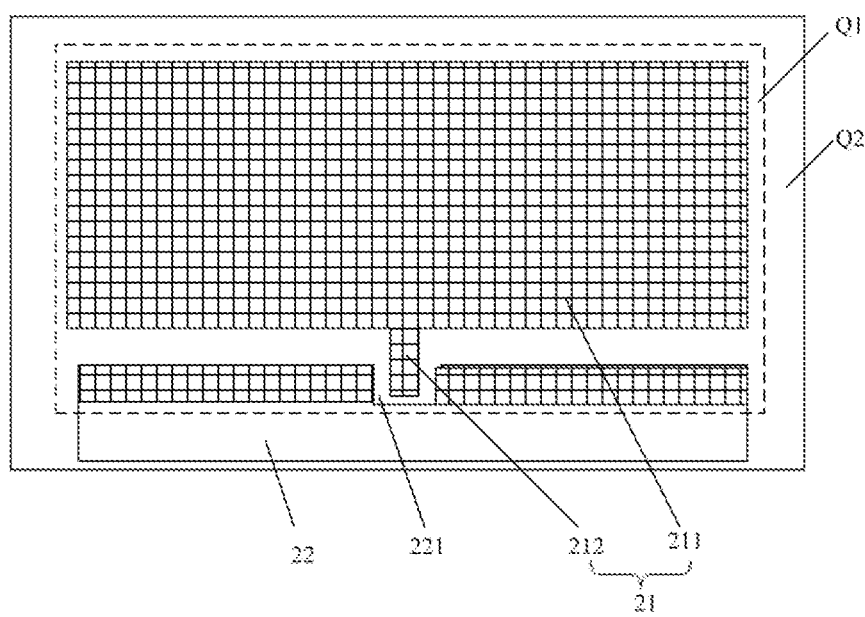
FIG. 2 is a top view of a CPW antenna.

FIG. 2 is a plan view of a CPW antenna. As shown in FIG. 2, a microstrip line 21 of the CPW antenna includes a main body 211 and a protrusion 212 connected to the main body 211, and a groove 221 is formed in a ground electrode 22; wherein the protrusion 212 of the microstrip line 21 is disposed corresponding to the groove 221 of the ground electrodes 22. An electromagnetic wave signal is fed from a position of the protrusion 212 of the microstrip line 21 and radiated through the microstrip line 21. In the embodiment of the present disclosure, the microstrip line 21 of the CPW antenna is disposed in the display area Q1 of the display panel, and in order to ensure that the display panel can display normally, the microstrip line 21 has a mesh structure, and the shape of each mesh is not limited in the embodiment of the present disclosure. Since the groove 221 of the ground electrode 22 is disposed corresponding to the protrusion 212 of the microstrip line 21, that is, as shown in FIG. 2, the protrusion 212 may extend into the groove 221, that is, a side of the ground electrode 22 having the groove 221 is located in the display area Q1 of the display panel, so that this part of the structure needs to meet the requirement that the display panel can normally display, therefore, the side of the ground electrode 22 having the groove 221 may also adopt a mesh structure, and the other part of the ground electrode 22 is located in the peripheral area Q2 of the display panel, so that the other part thereof may be of a solid planar structure and may be connected to a ground line on a side of the display backplane through conductive gold balls in a sealant in the peripheral area Q2 of the display panel.

In some embodiments, the microstrip line 21 and the ground electrode 22 of the CPW antenna may be formed through a method including, but not limited to, magnetron sputtering, thermal evaporation, electroplating, and the like. The materials of the microstrip line 21 and the ground electrode 22 may be the same or different from each other, and the materials used for the microstrip line 21 and the ground electrode 22 include, but are not limited to, a metal such as copper, gold, silver, and indium tin oxide, or a metal oxide, which have a low resistance and a low loss.

In some embodiments, the frequency selective surface 3 is located on a side of the microstrip line 21 of the CPW antenna close to a light exit surface; the frequency selective surface 3 and the layer where the microstrip line 21 of the CPW antenna is located may be connected by a transparent optical adhesive (OC adhesive). In order to ensure a certain distance between the frequency selective surface 3 and the microstrip line 21 of the CPW antenna, so that the frequency selective surface 3 can select the electromagnetic wave radiated by the CPW antenna, in some embodiments, a dielectric layer 5 with a certain thickness may be disposed between the frequency selective surface 3 and the layer where the microstrip line 21 of the CPW antenna is located. The dielectric layer 5 includes, but is not limited to, OC adhesive (Over Coating transparent optical adhesive). A thickness of the dielectric layer 5 is about 100 μm to 200 μm.

In some embodiments, the dielectric layer may include a first transparent bonding layer, a transparent display substrate layer, and a second transparent bonding layer, which are stacked; wherein the materials of the first transparent bonding layer and the second transparent bonding layer include but are not limited to OC adhesive; the material of the transparent display substrate layer includes, but is not limited to, COP (Cyclo Olefin Polymer) or PET (Polyethylene terephthalate). The larger the thickness of the dielectric layer is, the larger the radiation gain performance is improved. In the embodiment of the present disclosure, the thickness of the dielectric layer is greater than 100 μm, but the thickness of the dielectric layer should not be set too thick, and an appropriate thickness of the dielectric layer is selected to avoid affecting the overall thickness and performance of the display panel.

Figure 3:
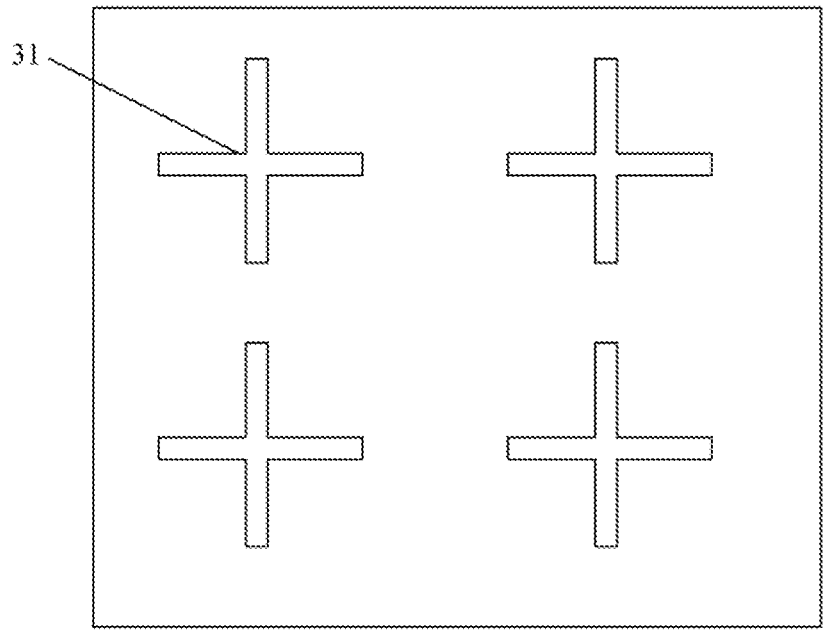
FIG. 3 is a schematic diagram of a frequency selective surface in a display panel according to an embodiment of the present disclosure.
Figure 4:
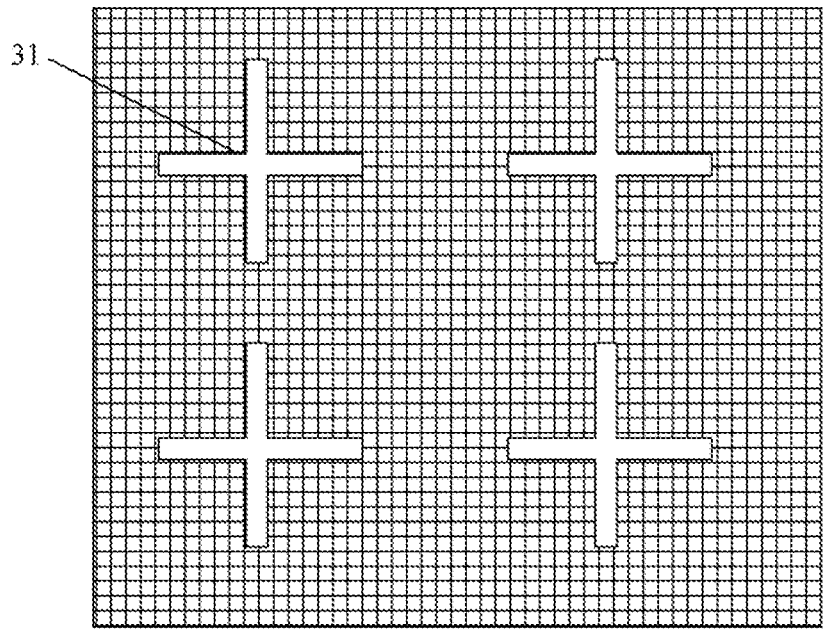
FIG. 4 is a schematic diagram of another frequency selective surface in a display panel according to an embodiment of the present disclosure.

In some embodiments, FIG. 3 is a schematic diagram of a frequency selective surface in a display panel according to an embodiment of the present disclosure; FIG. 4 is a schematic diagram of another frequency selective surface in a display panel according to an embodiment of the present disclosure. Since the frequency selective surface 3 is disposed in the display area Q1, in order to prevent the frequency selective surface 3 from affecting the normal display of the display panel, the frequency selective surface 3 may be made of a transparent conductive material, as shown in FIG. 3; or a mesh structure is selected as shown in FIG. 4, and the shape of each mesh is not limited in the embodiment of the present disclosure. In an embodiment of the present disclosure, where the frequency selective surface 3 is made of a transparent conductive material, the material of the frequency selective surface includes, but is not limited to, indium tin oxide, silver, or other transparent materials. In this case, the frequency selective surface 3 only has an opening structure 31 for selecting the frequency of the electromagnetic wave; the shape of the opening structure 31 includes, but is not limited to, a cross shape, and FIG. 3 only illustrates that the shape of the opening structure 31 is a cross shape. It should be noted here that the size of the opening structure 31 has a certain influence on radiation efficiency of the electromagnetic wave, so the size of the opening structure 31 in the frequency selective surface 3 is generally about one tenth of the wavelength, and the size of the opening structure 31 should not be too large, and if the size of the opening structure 31 is too large, the function of selecting the frequency and the efficiency is lost. As shown in FIG. 4, where the frequency selective surface 3 is of a mesh structure, the material thereof includes, but is not limited to, high conductive metal such as copper, gold, silver, etc., and the other parts in the frequency selective surface 3 except for the opening structures 31 are all of a mesh structure, and the size of each mesh in the mesh structure is much smaller than that of the opening structure 31.

It should be noted that, in order to avoid the frequency selective surface 3 from affecting the transmittance of the display panel in the embodiment of the present disclosure, a structure with a transmittance of 88% or more is selected. Meanwhile, in order to avoid the frequency selective surface 3 from affecting the thickness of the display panel, the thickness of the frequency selective surface 3 is ultra-thin, approximately about 0.3 um to 0.7 um in the embodiment of the present disclosure.

In some embodiments, a reflective electrode 4 is arranged on a side of the display backplane 1 away from the display panel, and the reflective electrode 4 is used for reflecting electromagnetic waves. A signal line on the display backplane 1 is bonded and connected to a flexible circuit board, and for realizing a narrow frame of the display panel, the flexible circuit board is turned over to a side of the display backplane 1 away from the display surface. In an embodiment of the present disclosure, the CPW antenna is disposed on a side of the display backplane 1 close to the display surface; in order to facilitate the bonding of the ground electrode 22 in the CPW antenna to the flexible printed circuit board, the ground electrode 22 and the reflective electrode 4 may be electrically connected to each other, and thus, a ground signal can be provided to the ground electrode 22 by bonding the signal line connected to the reflective electrode 4 and the flexible printed circuit board together.

In some embodiments, the reflective electrode 4 and the ground electrode 22 may be electrically connected to each other through conductive gold balls formed in the sealant in the peripheral area Q2 of the display panel. Alternatively, the reflective electrode 4 and the ground electrode 22 may be electrically connected to each other through a via penetrating the peripheral area Q2 of display panel.

In some embodiments, the display backplane 1 may be an organic light-emitting diode display backplane 1, or may be a liquid crystal display backplane 1. The display panel of the embodiment of the present disclosure is specifically described below with the display backplane 1 being an organic light-emitting diode display backplane 1 and a liquid crystal display backplane 1, respectively.

Figure 5:
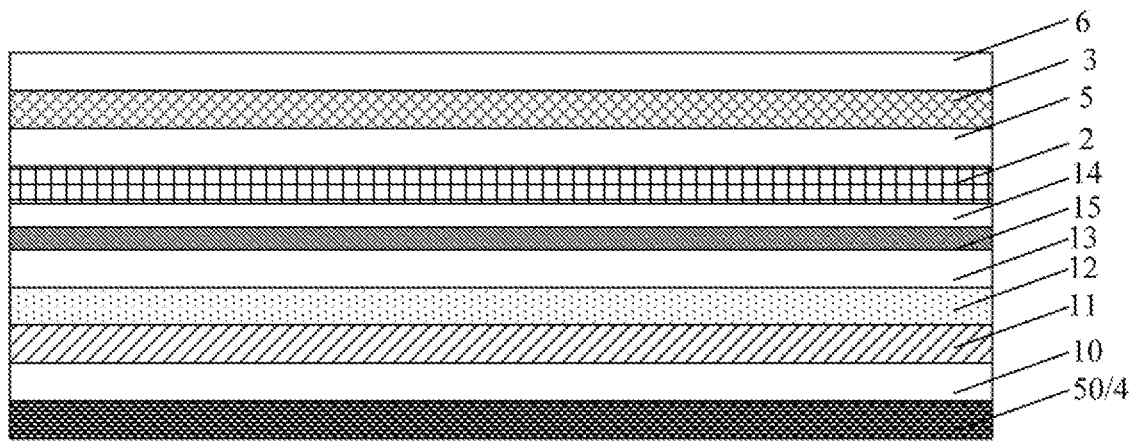
FIG. 5 is a schematic diagram of a specific structure of a display panel according to an embodiment of the present disclosure.

FIG. 5 is a schematic diagram of a specific structure of a display panel according to an embodiment of the present disclosure. In an example, as shown in FIG. 5, a display backplane 1 in a display panel adopts an organic light-emitting diode display backplane, and the display backplane 1 specifically includes a base substrate 10, and a plurality of pixel units, an encapsulation layer 13 and a polarization layer 14, which are sequentially arranged on the base substrate 10. Each pixel unit includes a pixel driving circuit 11 and an organic light-emitting diode 12 which are arranged in sequence; the pixel driving circuit 11 at least includes a driving transistor, a drain of which is connected to an anode of the organic light-emitting diode 12. The encapsulation layer 13 at least includes a first inorganic encapsulation layer 13, an organic encapsulation layer 13 and a second inorganic encapsulation layer 13 which are sequentially arranged on the organic light-emitting diode 12. The antenna structure 2 is disposed on a side of the polarization layer 14 close to the display surface, the frequency selective layer is disposed on a side of the antenna structure 2 close to the display surface, and a dielectric layer 5 is disposed between the antenna structure 2 and the frequency selective layer, where the dielectric layer 5 may be a transparent optical adhesive. A cover glass 6 is provided on a side of the frequency selective surface 3 close to the display surface. On a side of the display backplane 1 away from the display surface, is arranged a base plate 50, which may serve as a reflective electrode 4. Alternatively, the sealant in the peripheral area Q2 is disposed between the glass cover and the substrate base substrate 10. Where the antenna structure 2 adopts a CPW antenna, the ground electrode 22 of the antenna structure 2 may be connected to the reflective electrode 4 through conductive gold balls in the sealant.

In addition, in the embodiment of the present disclosure, the organic light-emitting diode display backplane 1 may be a display backplane 1 with a touch function, and a touch layer 15 may be further disposed between the layer where the organic light-emitting device of the display backplane 1 is located and the polarization layer 14.

Figure 6:
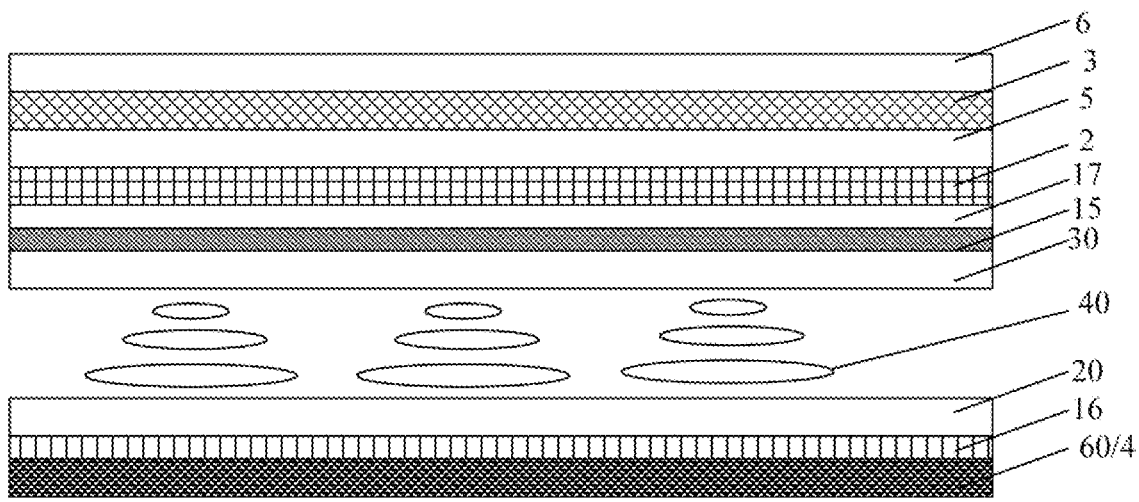
FIG. 6 is a schematic diagram of another specific structure of a display panel according to an embodiment of the present disclosure.

FIG. 6 is a schematic diagram of another specific structure of a display panel according to an embodiment of the present disclosure. In another example, as shown in FIG. 6, the display backplane 1 in the display panel is a liquid crystal display backplane. The liquid crystal display backplane includes: an array substrate 20 and a color filter substrate 30, which are arranged opposite to each other; and a liquid crystal layer 40, which is arranged between the array substrate 20 and the color filter substrate 30. The display backplane 1 further includes a lower polarizer 16 disposed on a side of the array substrate 20 away from the display surface, and an upper polarizer 17 disposed on a side of the color filter substrate 30 close to the display surface. The antenna structure 2 is arranged on a side of the upper polarizer 17 close to the display surface, the frequency selective layer is arranged on a side of the antenna structure 2 close to the display surface, and the dielectric layer 5 is arranged between the antenna structure 2 and the frequency selective layer, wherein the dielectric layer 5 may be a transparent optical adhesive. A cover glass 6 is provided on a side of the frequency selective surface 3 close to the display surface. A backlight and a back plate 60 are sequentially arranged on a side of the display backplane 1 away from the display surface, and the back plate 60 may serve as the reflective electrode 4. Alternatively, the sealant in the peripheral area Q2 is disposed between the glass cover and the array substrate 20. Where the antenna structure 2 adopts a CPW antenna, the ground electrode 22 of the antenna structure 2 may be connected to the reflective electrode 4 through conductive gold balls in the sealant.

In addition, the liquid crystal display backplane 1 in the embodiment of the present disclosure may be a display backplane 1 having a touch function. A touch layer 15 is disposed between the color filter substrate 30 and the upper polarizer 17 of the display backplane 1.

In an embodiment of the present disclosure, the display backplane 1 may alternatively be a quantum dot light-emitting diode display backplane (QD LCD) based on quantum dot electroluminescence characteristics or a quantum dot backlight display backplane (QLED) based on quantum dot electroluminescence characteristics. Where the two display backplates are used, other film structures in the display panel may be the same as the two embodiments described above, so that other structures in the display panel are not described in detail here.

In a second aspect, an embodiment of the present disclosure provides a display apparatus, which includes the display panel described above, so that the performance of the display apparatus is better.

The display apparatus may be a liquid crystal display apparatus or an electroluminescent display apparatus, such as any product or component having a display function, for example, a liquid crystal panel, an electronic paper, an OLED panel, a mobile phone, a tablet computer, a television, a monitor, a notebook computer, a digital photo frame, a navigator, and the like.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the scope of the present disclosure.

What is claimed is:

1. A display panel, comprising a display backplane and an antenna structure, wherein the display panel further comprises a frequency selective surface on a side of the antenna structure close to a light exit surface of the display panel; and
    the frequency selective surface is configured to transmit an electromagnetic wave with a specific frequency, so as to enhance a radiation gain of the antenna structure,
    wherein the display panel has a display area and a peripheral area surrounding the display area; the antenna structure comprises a microstrip line and a reference electrode in a same layer as the microstrip line; the microstrip line is in the display area; and the reference electrode is at least partially in the peripheral area; and
    a part of the reference electrode in the peripheral area is of a solid planar structure and connected to a ground line on a side of the display backplane through conductive gold balls in a sealant in the peripheral area.

2. The display panel according to claim 1, wherein the display panel has a display area and a peripheral area surrounding the display area; the antenna structure is on a side of the display backplane close to the light exit surface, and at least a part of the antenna structure is in the display area.

3. The display panel according to claim 1, further comprising a dielectric layer between the frequency selective surface and the antenna structure.

4. The display panel according to claim 3, wherein the dielectric layer has a thickness greater than 100 μm.

5. The display panel according to claim 3, wherein the dielectric layer comprises a first transparent bonding layer, a transparent display substrate layer, and a second transparent bonding layer, which are stacked together.

6. The display panel according to claim 1, further comprising a reflective electrode on a side of the display backplane away from the light exit surface of the display panel; and the reference electrode is connected to the reflective electrode.

7. The display panel according to claim 1, wherein the microstrip line comprises a mesh structure.

8. The display panel according to claim 1, wherein the frequency selective surface comprises a planar structure or a mesh structure.

9. The display panel according to claim 1, wherein the display backplane comprises any one of a liquid crystal display backplane, an organic light-emitting diode display backplane, a quantum dot light-emitting diode display backplane or a quantum dot backlight display backplane.

10. A display apparatus, comprising the display panel according to claim 1.

11. The display apparatus according to claim 10, wherein the display panel has a display area and a peripheral area surrounding the display area; the antenna structure is on a side of the display backplane close to the light exit surface, and at least a part of the antenna structure is in the display area.

12. The display apparatus according to claim 10, wherein the display panel further comprises a dielectric layer between the frequency selective surface and the antenna structure.

13. The display apparatus according to claim 12, wherein the dielectric layer has a thickness greater than 100 μm.

14. The display apparatus according to claim 12, wherein the dielectric layer comprises a first transparent bonding layer, a transparent display substrate layer, and a second transparent bonding layer, which are stacked together.

15. The display apparatus according to claim 10, wherein the display panel further comprises a reflective electrode on a side of the display backplane away from the light exit surface of the display panel; and the reference electrode is connected to the reflective electrode.

16. The display apparatus according to claim 10, wherein the microstrip line comprises a mesh structure.

17. The display apparatus according to claim 10, wherein the frequency selective surface comprises a planar structure or a mesh structure.

18. The display apparatus according to claim 10, wherein the display backplane comprises any one of a liquid crystal display backplane, an organic light-emitting diode display backplane, a quantum dot light-emitting diode display backplane or a quantum dot backlight display backplane.

* * * * *